(12) United States Patent
Gill (10) Patent No.: US 10,809,098 B2
(45) Date of Patent: Oct. 20, 2020

(54) PULSE-INDUCTION DISPLACEMENT TRANSDUCER

(71) Applicant: Gill Corporate Limited, New Milton (GB)

(72) Inventor: Michael John Gill, Hampshire (GB)

(73) Assignee: GILL CORPORATE LIMITED, New Milton (GB)

( * ) Notice: Subject to any disclaimer, the term of this patent is extended or adjusted under 35 U.S.C. 154(b) by 24 days.

(21) Appl. No.: 16/092,691

(22) PCT Filed: Apr. 21, 2017

(86) PCT No.: PCT/EP2017/025098
§ 371 (c)(1),
(2) Date: Oct. 10, 2018

(87) PCT Pub. No.: WO2017/194195
PCT Pub. Date: Nov. 16, 2017

(65) Prior Publication Data
US 2019/0128701 A1    May 2, 2019

(30) Foreign Application Priority Data
May 10, 2016 (GB) .................................. 1608207.5

(51) Int. Cl.
*G01B 7/14* (2006.01)
*G01D 5/20* (2006.01)
*H03K 17/95* (2006.01)

(52) U.S. Cl.
CPC ... *G01D 5/2006* (2013.01); *H03K 2017/9527* (2013.01)

(58) Field of Classification Search
CPC ...... G01D 5/2013; G01D 5/202; G01D 5/208; G01D 5/206; G01D 5/2046; G01D 5/2053;
(Continued)

(56) References Cited

U.S. PATENT DOCUMENTS

4,364,045 A     12/1982 Spiegel
4,853,604 A *   8/1989 McMullin ............ G01D 5/2053
                                                318/653
(Continued)

*Primary Examiner* — Thang X Le
(74) *Attorney, Agent, or Firm* — The Small Patent Law Group LLC; Jason P. Gross (57) ABSTRACT

A pulse-induction displacement transducer comprising at least one coil component (100,150), at least one target (112,174), and pulse induction circuitry (102,152} constructed and arranged to cause a pulse of electrical current to pass through the said at least one coil component (100,150). The pulse ends abruptly. Subsequently, the electrical current passing through the said at least one coil component (100, 150), or the voltage across it, is measured at a time when any electrical current through or voltage across the said at least one coil component (100, 150) would have died away in. the absence of a target. This provides an indication of the relative position between the target (112,174) and the said at least one coil component (100, 150). The said at least one coil component (100,150) comprises a first terminal portion (108,158), a first coil part (104,152) connected directly or indirectly to the said first terminal portion (108,158) and wound in one sense. The coil component (100,150) also comprises, in series with the said first coil part (104, 152), a second coil part (164) wound in the opposite sense. The said second coil part (106,164) is connected directly or indirectly to a second terminal portion (110, 168). The said pulse induction circuitry (102,152) is connected between the said first terminal portion (108,158) and the said second terminal portion (110,168).

9 Claims, 8 Drawing Sheets

(58) Field of Classification Search
CPC .. G01D 5/2073; G01D 5/2216; G01D 5/2225;
G01D 5/2291; G01B 7/02; G01B 7/003;
G01B 7/004
See application file for complete search history.

(56) References Cited

U.S. PATENT DOCUMENTS

| | | | | |
|---|---|---|---|---|
| 5,712,563 | A * | 1/1998 | Kawagoe | B62D 6/10 |
| | | | | 318/653 |
| 6,629,020 | B1 | 9/2003 | Thomsen | |
| 6,693,420 | B1 * | 2/2004 | Gill | G01D 5/2013 |
| | | | | 324/207.16 |
| 6,999,007 | B2 * | 2/2006 | Lin | G01D 5/2073 |
| | | | | 178/18.06 |
| 2008/0278152 | A1 * | 11/2008 | Diez Garcia | G01R 33/025 |
| | | | | 324/225 |
| 2009/0302868 | A1 * | 12/2009 | Feucht | G01D 5/2013 |
| | | | | 324/654 |
| 2010/0277162 | A1 | 11/2010 | Feucht et al. | |
| 2011/0234210 | A1 * | 9/2011 | Hayashi | H01F 7/1844 |
| | | | | 324/207.15 |
| 2015/0354991 | A1 * | 12/2015 | Graf | G01D 5/2013 |
| | | | | 324/207.15 |

* cited by examiner

PULSE-INDUCTION DISPLACEMENT TRANSDUCER

RELATED APPLICATIONS

The present application is a National Stage of International Application No. PCT/EP2017/025098, filed on Apr. 21, 2017, and claims the benefit of United Kingdom Patent Application No. 1608207.5, filed on May 10, 2016.

BACKGROUND

Embodiments relate to a pulse-induction displacement transducer.

SUMMARY OF EMBODIMENTS OF THE DISCLOSURE

In an embodiment, a pulse-induction displacement transducer is provided that includes at least one coil component, at least one target, and pulse induction circuitry constructed and arranged to cause a pulse of electrical current to pass through the said at least one coil component which pulse ends abruptly, and subsequently to measure the electrical current passing through the said at least one coil component, or a voltage across it, at a time when any electrical current through or voltage across the said at least one coil component would have died away in the absence of a target, so as to provide an indication of a relative position between the target and the said at least one coil component. The said at least one coil component includes a first terminal portion, a first coil part connected directly or indirectly to the said first terminal portion and wound in one sense and, in series with the said first coil part, a second coil part wound in the opposite sense. The said second coil part is connected directly or indirectly to a second terminal portion, and the said pulse induction circuitry is connected between the said first terminal portion and the said second terminal portion.

BRIEF DESCRIPTION OF THE DRAWINGS

Examples of pulse-induction displacement transducers made in accordance with the present invention will now be described in greater detail with reference to the accompanying drawings in which.

DETAILED DESCRIPTION OF EMBODIMENTS OF THE DISCLOSURE

Figure 1:
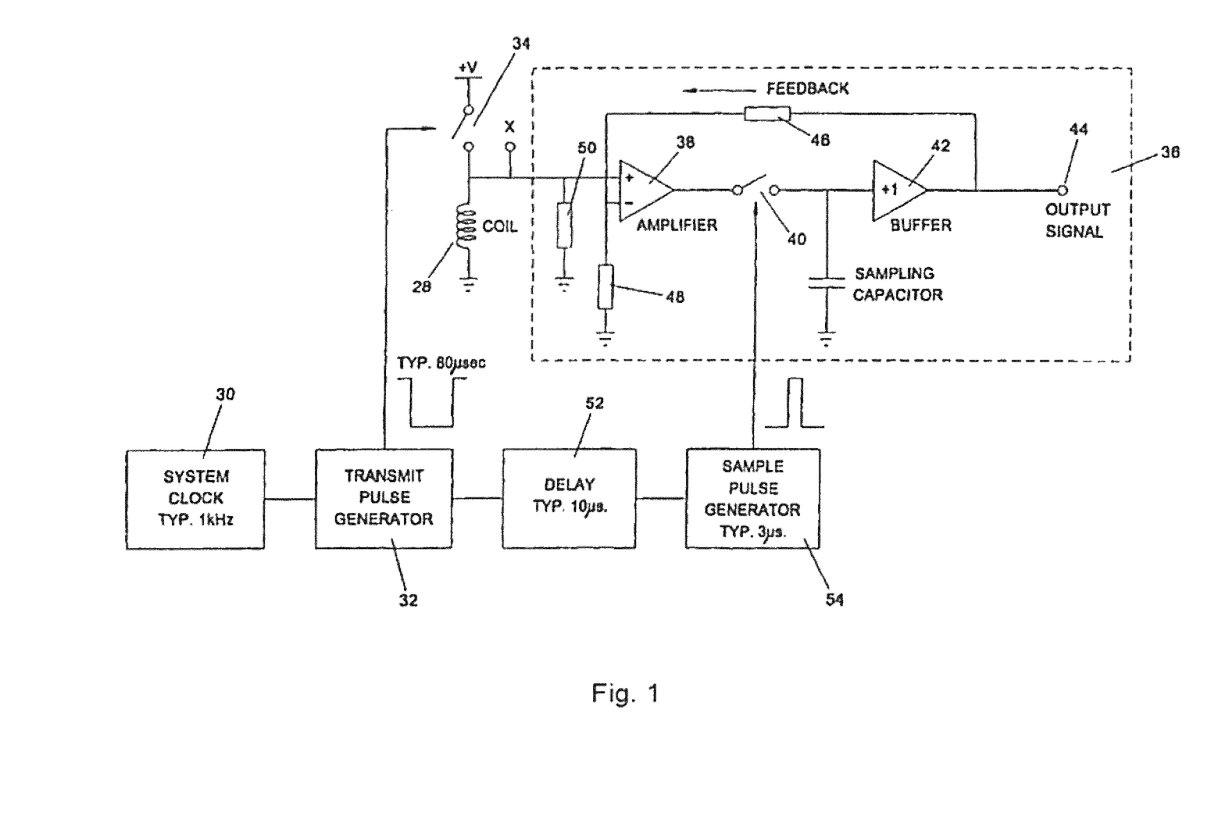
FIG. 1 shows electronic circuitry for generating an electrical pulse and applying it to a coil, and also subsequently measuring an electrical parameter in relation to the coil.

The present invention relates to a pulse-induction displacement transducer comprising at least one coil component, at least one target, and pulse induction circuitry constructed and arranged to cause a pulse of electrical current to pass through the said at least one coil component which pulse ends abruptly, and subsequently to measure the electrical current passing through the said at least one coil component, or the voltage across it, at a time when any electrical current through or voltage across the said at least one coil component would have died away in the absence of a target, so as to provide an indication of the relative position between the target and the said at least one coil component, The present invention relates to a pulse-induction displacement transducer comprising at least one coil component, at least one target, and pulse induction circuitry constructed and arranged to cause a pulse of electrical current to pass through the said at least one coil component which pulse ends abruptly, and subsequently to measure the electrical current passing through the said at least one coil component, or the voltage across it, at a time when any electrical current through or voltage across the said at least one coil component would have died away in the absence of a target, so as to provide an indication of the relative position between the target and the said at least one coil component, Such a transducer is described and illustrated in EP1121572B. The whole contents of that patent specification are hereby imported into the present specification by direct reference. The present FIG. 1 shows electronic circuitry also illustrated and described in that prior patent specification, for generating an electrical pulse and applying it to a coil, and also subsequently measuring an electrical parameter in relation to the coil. The manner in which it operates is referred to herein as pulse induction. More especially, the block circuit diagram shown in FIG. 1 shows circuitry used in conjunction with a coil 28. This comprises a system clock 30 connected to deliver electrical clock pulses to a pulse generator 32. This delivers a SQµsec switching pulse to a switch 34 so that, during that time, the switch is closed and the voltage of about 5 volts is connected to one end of the coil 28, the other being earthed. Also connected across the coil are voltage measuring means 36 comprising a differential amplifier 38, a switch 40 and buffer amplifier 42 connected in series with one another with an output signal 44 being taken from the output of the buffer amplifier 42, the positive input to the differential amplifier being connected to the non-earthed end of the coil 28 and the negative input of the differential amplifier being connected to a point between two series connected resistors 46 and 48 constituting a feedback from the buffer amplifier 42 and connected to earth. The positive connection to the differential amplifier 38 is also connected to earth by a resistor 50, A time delay 52 is also connected to the pulse generator 32, and a pulse generator 54 generating a pulse of approximately 3 µsec is connected to receive a signal from a delay 52 and cause the switch 40 to be closed for that pulse period.

Considering the operation of the circuitry shown in FIG. 1, the system clock 30 causes the puke generator 32 to close the switch 34 for a period of approximately 80 µsec. This energises the coil 28 for that period such that the voltage across the winding has a step function as shown in the graph in FIG. 2, When this pulse ends at time t0 in FIG. 2, the self-inductance of the coil 28 causes the voltage across it to fall sharply to a negative value of a magnitude well in excess of the 5 volts it had initially, whereafter at time t1 it starts to rise again and to reach zero value at about time t2 following an exponential curve C1 between time t1 and t2. However, with the presence of an electrically-conductive target near the coil, it follows the broken curve C2, in which the decay of a negative voltage across the coil 28 is slowed down so that the voltage does not come to zero value again until about time t3» well after time t2. Thus, the switch 40 receives the pulse which closes it for about 3 μsec, about 10μsec after the coil 28 was de-energised (by which time the excitation energy has completely died away). This therefore provides a measure of the voltage across the coil 28 at time t4, about 20 μsec after time t0 and lasting for about a period of 3 μsec.

Figure 2:
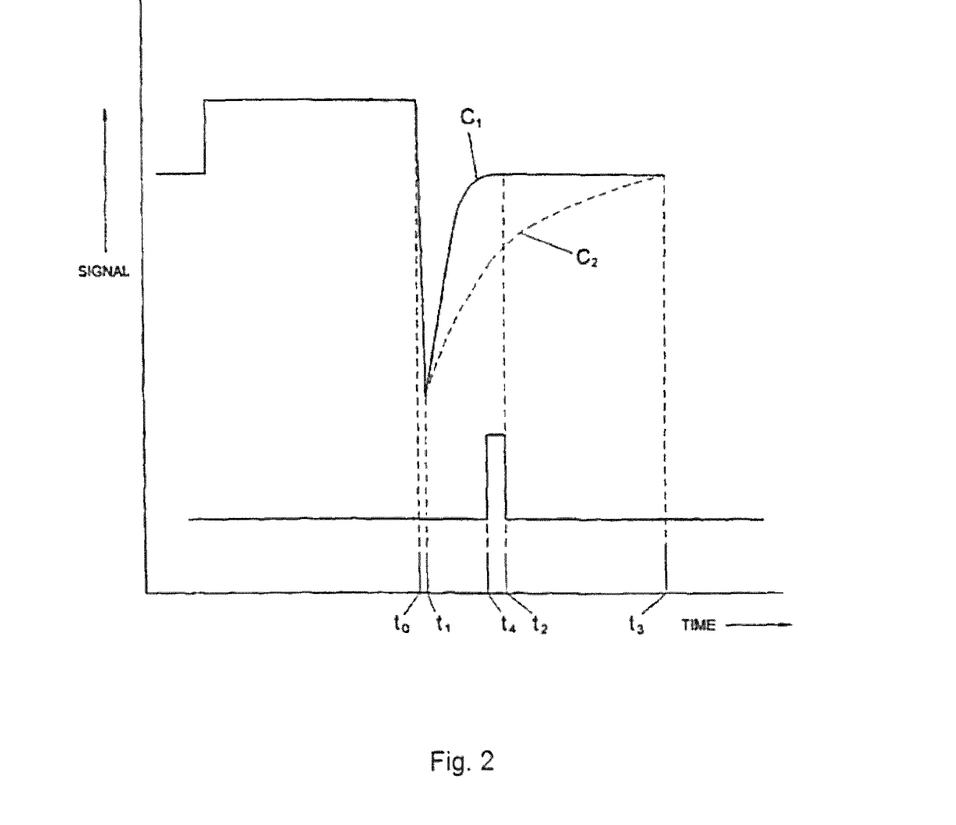
FIG. 2 illustrates a step function of a voltage across a winding.

It will be appreciated that the specific values given in relation to the circuitry shown in FIG. 1 and the timings given in relation to FIG. 2 provide an example only of the construction and operation of pulse induction circuitry. Pulse-induction circuitry currently used would be in microchip form, possibly having an equivalent operation to the circuitry shown in FIG. 1, but possibly of a different construction or operation. What is common to the operation of all pulse induction circuits is that they all cause a pulse of electrical current to pass through a coil component which pulse ends abruptly, and subsequently measure the electrical current passing through the coil component, or the voltage across it, at a time when any electrical current through or voltage across the coil coraponent would have died away in the absence of a target having electrically conductive material.

One problem encountered with the constructions of pulse-induction displacement transducers described and illustrated in EP1121572B is that they are all vulnerable to being adversely affected by stray alternating or otherwise changing magnetic fields. For example, if one of the pulse-induction displacement transducers described and illustrated in EP1121572B is coupled to the accelerator pedal of an automotive vehicle, to control the amount of fuel fed to an engine of the vehicle, a dynamo or an electric motor of the vehicle may generate alternating magnetic fields which adversely affect the pulse-induction displacement transducer, so that it gives a false reading.

The present invention seeks to provide a remedy,

Accordingly, the present invention is directed to a pulse-induction displacement transducer having the construction set out in the opening paragraph of the present specification, characterised in that the said at least one coil component comprises a first terminal portion, a first coil part connected directly or indirectly to the said first terminal portion and wound in one sense and, in series with the said first coil part, a second coil pail wound in the opposite sense, the said second coil part being connected directly or indirectly to a second terminal portion, and the said pulse induction circuitry being connected between the said first terminal portion and the said second terminal portion.

With such a construction of pulse-induction displacement transducer, any stray alternating magnetic field will tend to cause opposite voltages in the two coil parts, so as to reduce or cancel the effect of such a stray field on the total voltage across or electrical current passing through the coil.

A substantially complete cancellation of such an effect may be achieved if the two coil parts are of the same size and number of turns, or if one of the coil parts is smaller but has a larger number of turns, for example if it is half the size but with twice the number of turns.

The target may cover the two coil parts wholly or partially, to reduce even further the likelihood of interference from a stray alternating magnetic field. For example the target may comprise two plates of electrically conductive material positioned on opposite sides of the two coil parts. To ensure that the extent to which the two coil parts are protected by the target from stray changing magnetic fields is substantially the same, the extent to which the target covers the two coil parts should be the same irrespective of the relative position between the target and the coil component.

The two coil parts may be arranged so that there is substantially no overlap between them. As a result, because the source of any stray alternating magnetic field will be much further away from the two coil parts and the target, any adverse effect of the magnetic field on the two coil parts will be substantially the same. However, without overlap between them, neither will adversely affect the contribution made by the other to the output of the pulse-induction circuitry.

The two coil parts may comprise a copper deposit on a printed circuit board. The circuit board may be used to even greater effect if respective halves of each coil part are on opposite sides of the circuit board.

The transducer may be constructed to enable a relative rotary motion between the coil component and the target if the coil component and the target of provided in arcuate form.

Figure 3:
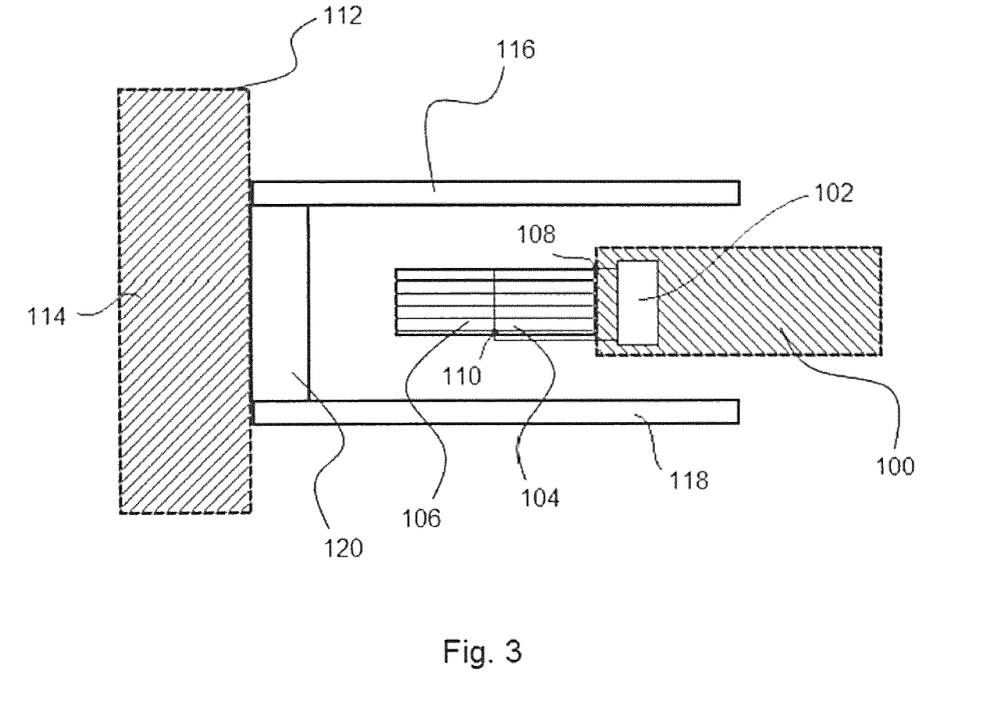
FIG. 3 shows a side view of a first embodiment of a pulse-induction displacement transducer embodying the present invention.

The pulse-induction displacement transducer shown in FIG. 3 comprises a coil component 100 incorporating circuitry 102 in the form of a microchip constructed and programmed to operate in accordance with FIGS. 1 and 2, The coil component 100 also has a coil having a first part 104 wound in. a first sense, and. a second part 106 wound in the opposite sense. The coil parts 104 and 106 are connected together in series and, the circuitry is connected across the combination of the coil parts 1.04 and 106, that is to say across the terminal end 108 of the first coil part 104 and the terminal end 110 of the second coi 1 part. 106.

Supported adjacent to the coil component 100 in such a manner as to the movable laterally, along the line of view of FIG. 3, is a target 112 comprising a support 114 from which extend two plates 116 and 118 of electrically conductive material, one located above the coil parts 104 and 106, and the other located below the coil parts 104 and 106. A yolk 120 extends between and supports the two plates 116 and 118. The support 114 and the yolk 120 are preferably made of a non-ferromagnetic material to ensure that they do not affect the coil part 106, to which they are closer, more than the coil part 104, At the same time, the plates 116 and 118 extend well beyond the coil part 104 and 106 to ensure that the coil part 104 is no more exposed to stray alternating magnetic fields than, the coil part 106. This is shown more clearly diagrammatically in FIG. 4. It will be particularly appreciated that as the plates 116 and 118 are moved for example to the left in FIG. 4, as the right-hand edges 122 of the plates 116 and 118 move beyond the right-hand extremities of the coil parts 104 and 106, to expose the latter, the extent to which those two coil parts 104 and 106 are thus exposed is the same, so that it would be expected that they will be affected by any changing magnetic stray field to substantially the same degree, so that the overall effect will be substantially zero.

Turning now to the embodiment of pulse-induction displacement transducer shown in FIGS. 5 to 8, this comprises a printed circuit board 150 on which a copper deposit is printed in the form of a first coil part 152 which is slightly arcuate and is rectangular in shape, starting at a terminal 154 connected to circuitry 156 and winding anti-clockwise (as viewed in FIG. 5) inwardly until it reaches a terminal 158. The latter is in electrical connection with a terminal 160 on the opposite side of the printed circuit board 150. From this terminal 160, a further half of the coil part 152 is printed in the form of a continuation of the first coil part 152 also wound in an anti clockwise sense, part this time extending outwardly with each. turn, until it reaches a position 162 at which it passes to a second coil part 164 which is wound in a clockwise sense ever inwardly until it reaches a terminal 166. The latter is also slightly arcuate and is rectangular in shape, and is in electrical connection with a further terminal 168 which is on the first side of the printed circuit board. From this terminal 168 the second coil part 164 is continued by way of a copper deposit in the form of a slightly arcuate rectangular coil extending in a clockwise sense but outwardly with successive turns of the coil until it reaches position 170 where it extends to a second terminal 172 connected to the circuitry 156. The coil parts 152 and 164 together with the printed circuit board 150 constitute a coil component 173.

Figure 5:
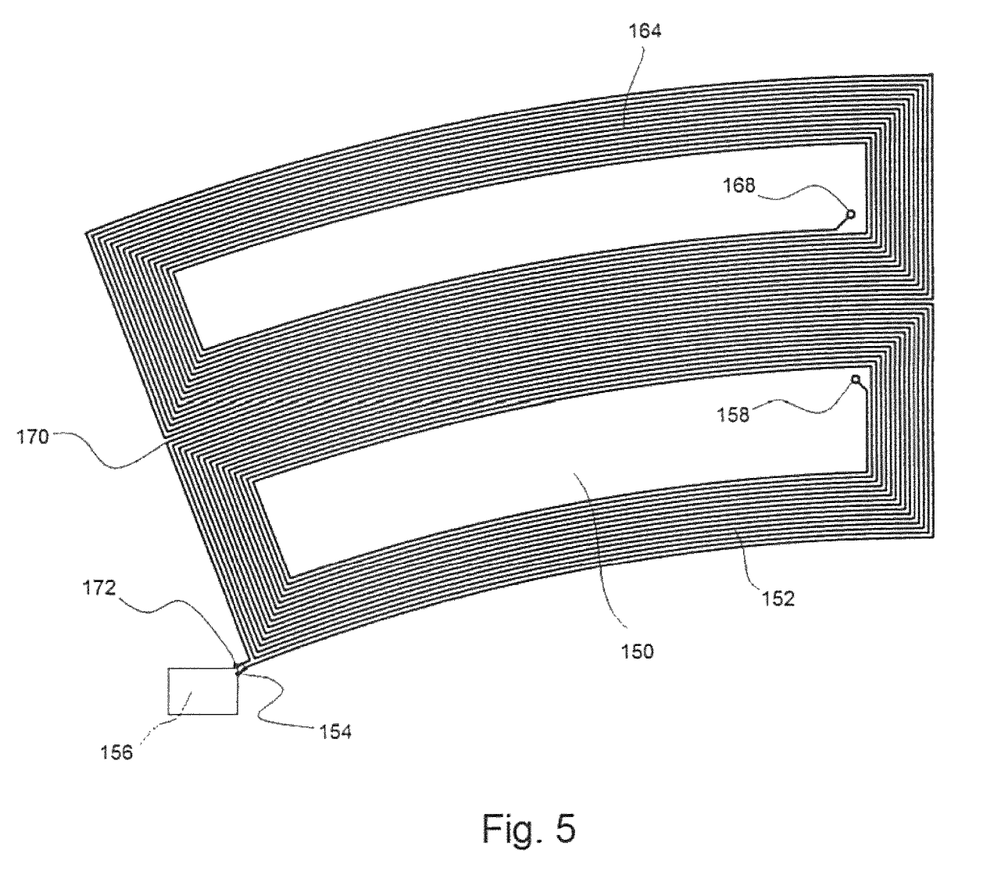
FIG. 5 is a view from above of the print of copper on a printed circuit board constituting a coil component of a second embodiment of a pulse-induction displacement transducer embodying the present invention.
Figure 6:
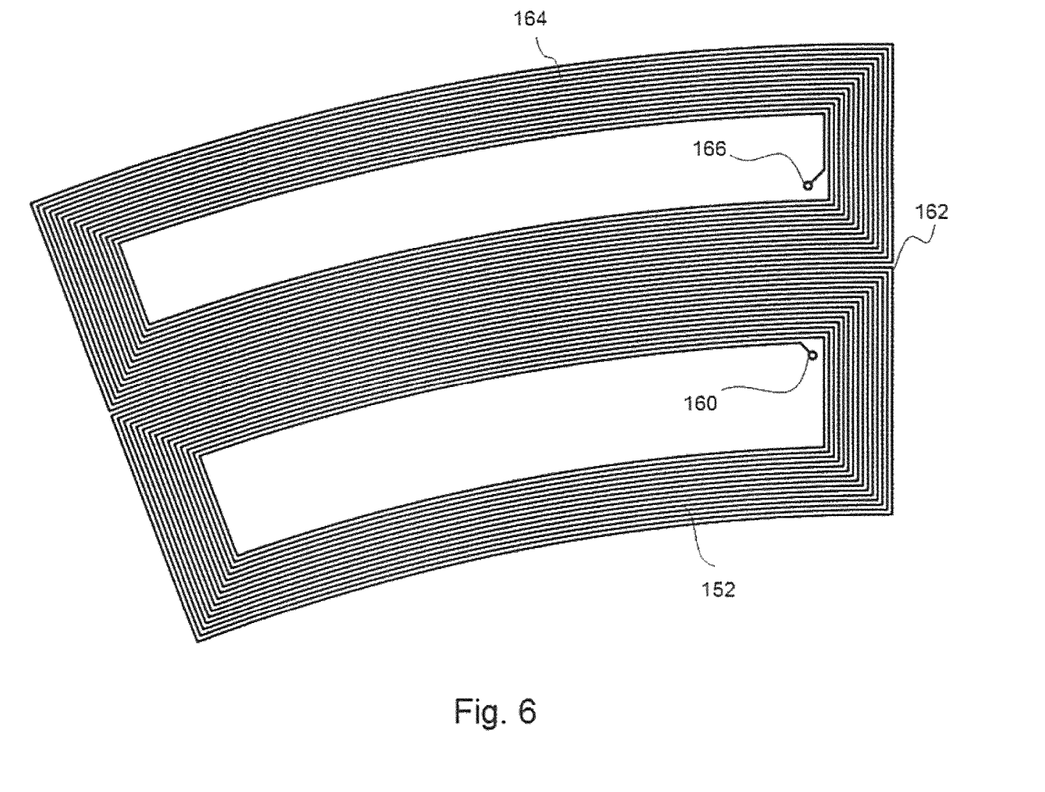
FIG. 6 is also a view from above of copper on the printed circuit board shown in FIG. 5 on the opposite side thereof to the print which is shown in FIG. 5, but with the print of FIG. 5 and the circuit board itself removed to enable the print of FIG. 6 to be viewed in the same direction as the print shown in FIG. 5.
Figure 7:
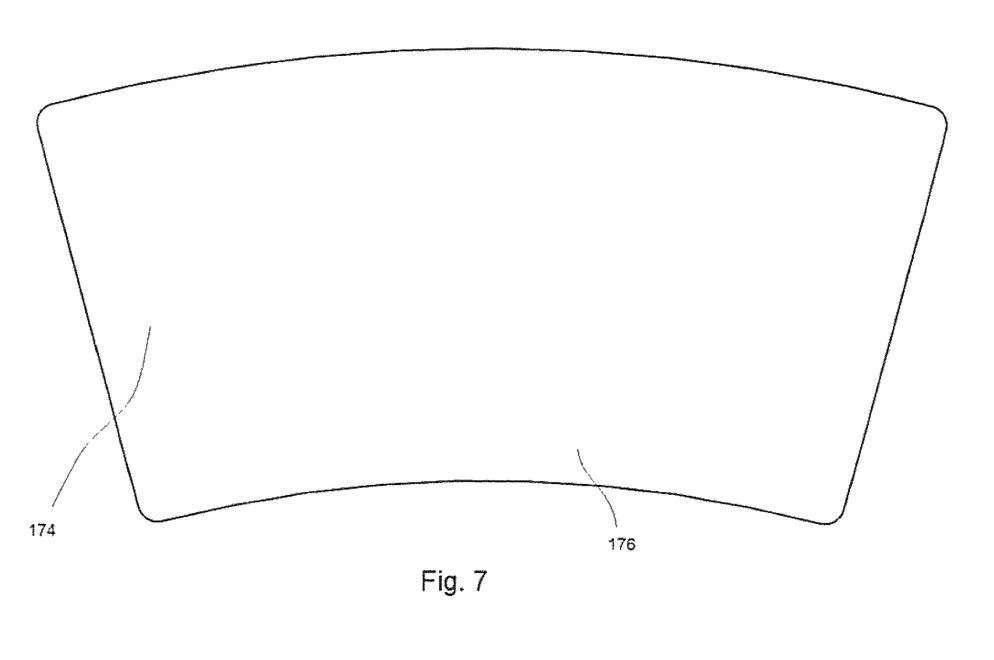
FIG. 7 shows a view from above of a target of the transducer the coil component of which is shown in FIGS. 5 and 6.
Figure 8:
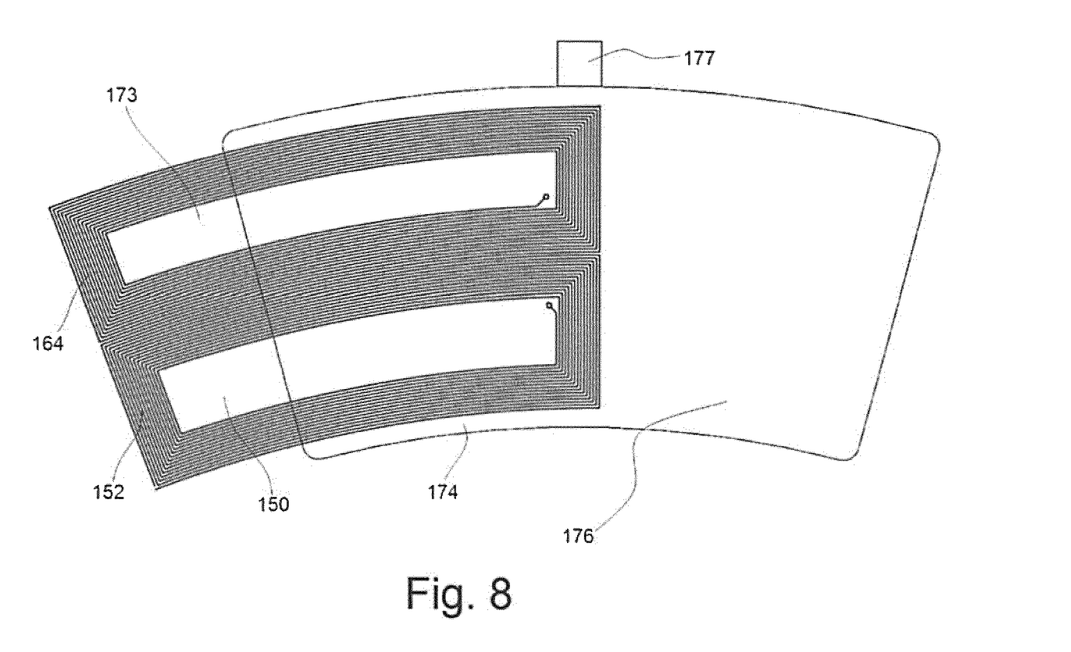
FIG. 8 shows from above the transducer, the coil component and the target of which is shown in FIGS. 5 to 7.

It will be appreciated that there is no overlap between the coil parts 152 and 164.

The transducer shown in FIGS. 5 to 8 is also provided with a slightly arcuate rectangular target 174, which may comprise two plates 176 (only one of which is visible in FIGS. 7 and 8) connected to one another by way of a non-ferrous yolk 177 and arranged on opposite sides respectively of the printed circuit board 150 with the two plates either covering the coil parts 152 and 164 completely, or covering them to the same extent, depending upon whether the coil component 173 and the target. 174 are at one extremity of their relative arcuate movement, in which the coil parts 152 and 164 are wholly between the plates 176, or whether the position of the coil component 173 relative to the target 174 is displaced significantly from this position.

Figure 4:
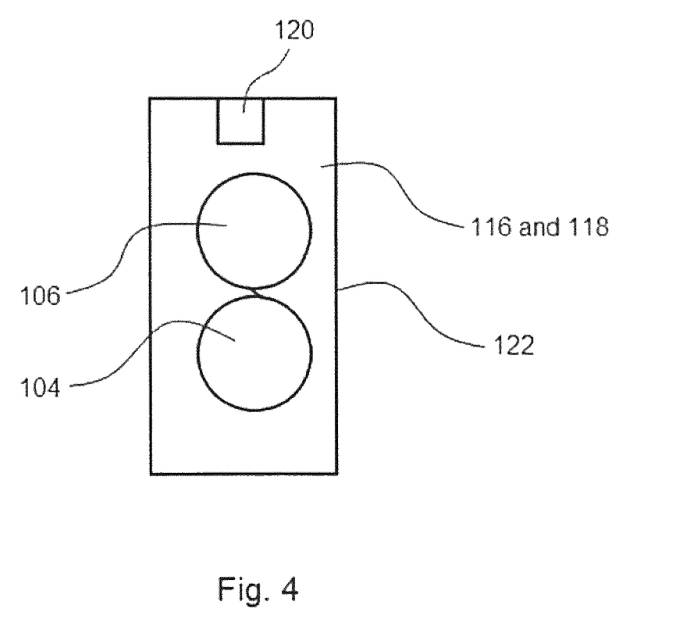
FIG. 4 shows diagrammatically a view from above of the transducer shown in FIG. 3.

It will be appreciated from the description with reference to FIGS. 1 and 2, that when the transducer shown in FIGS. 3 and 4 is in use, the output from the circuitry 102 would be dependent upon the relative position of the coil component 100 relative to the target 112, and the output from the circuitry 156 in the transducer shown in FIGS. 5 to 8 will be dependent upon the relative displacement between the coil component 173 and the target 174.

Numerous variations and modifications to the illustrated embodiments of the present invention may occur to the reader without taking the resulting construction outside the scope of the present invention. For example, although the coil part 152 in the embodiment shown in FIGS. 5 to 8 has 15 turns on one side of the printed circuit board and 15 on the other, as does the coil part 164 (although there could be almost any number of turns), but with the width of the innermost turn of each half of the coil part 164 slightly less than that of the coil part 152 to compensate for the fact that the average length of the coil part 164 is greater than that of the coil part 152, an alternative might be to have the width substantially the same but the number of turns of the coil part 164 one or two less according to the overall dimensions of the coil component. Two or more parts of the coil may be wound in one sense which may alternate with two or more parts of the coil wound in the opposite sense, provided those parts wound in one sense are displaced laterally at least to some extent from those wound in the opposite sense.

The invention claimed is:

1. A pulse-induction displacement transducer comprising at least one coil component, at least one target, and pulse induction circuitry constructed and arranged to cause a pulse of electrical current to pass through the at least one coil component which pulse ends abruptly, and subsequently to measure the electrical current passing through the at least one coil component, or a voltage across the at least one target, at a time when any electrical current through or voltage across the at least one coil component would have died away in the absence of the at least one target, so as to provide an indication of a relative position between the target and the at least one coil component in which:

the at least one coil component comprises a first terminal portion, a first coil part electrically connected to the first terminal portion and wound in one sense, the at least one coil component also comprises a second coil part wound in the opposite sense, the second coil part being electrically connected to a second terminal portion, in which the first and second coil parts are electrically connected in series between the first terminal portion and the second terminal portion; and the pulse induction circuitry is also electrically connected between the first terminal portion and the second terminal portion, in which the first and second coil parts are arranged so that there is substantially no overlap between them, the at least one target being moveable so that the at least one target covers the first and second coil parts wholly or partially to expose the first and second coil parts, the extent to which the first and second coil parts are thus exposed being the same irrespective of the relative position between the at least one target and the first and second coil parts.

2. A pulse-induction displacement transducer according to claim 1, wherein the first and second coil parts are of the same size and number of turns.

3. A pulse-induction displacement transducer according to claim 1, wherein one of the coil parts is smaller but has a larger number of turns.

4. A pulse-induction displacement transducer according to claim 3, wherein one of the coil parts is half the size of the other, hut has twice the number of turns.

5. A pulse-induction displacement transducer according to claim 1, wherein the target comprises two plates of electrically conductive material positioned on opposite sides of the first and second coil parts.

6. A pulse-induction displacement transducer according to claim 1, wherein the first and second coil parts comprise a copper deposit on a printed circuit board.

7. A pulse-induction displacement transducer according to claim 6, wherein respective halves of each coil part are on opposite sides of the circuit board.

8. A pulse-induction displacement transducer according to claim 1, wherein the transducer is constructed to enable a relative rotary motion between the coil component and the target, and the coil component and the target are in arcuate form.

9. A pulse-induction displacement transducer according to claim 1, wherein the at least one target is moveable relative to the first and second coil parts such that, when the at least one target is moved to expose the first and second coil parts, the exposure to stray alternating magnetic fields is the same irrespective of the relative position between the at least one target and the first and second coil parts.

\* \* \* \* \*